(12) United States Patent
Manger et al.

(10) Patent No.: US 9,235,142 B2
(45) Date of Patent: Jan. 12, 2016

(54) PROJECTION EXPOSURE SYSTEM FOR MICROLITHOGRAPHY AND METHOD OF MONITORING A LATERAL IMAGING STABILITY

(75) Inventors: Matthias Manger, Aalen-Unterkochen (DE); Armin Rauthe-Schoech, Hofheim am Taunas (DE); Ulrich Mueller, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 1237 days.

(21) Appl. No.: 12/978,103

(22) Filed: Dec. 23, 2010

(65) Prior Publication Data

US 2011/0157571 A1 Jun. 30, 2011

Related U.S. Application Data

(63) Continuation of application No. PCT/EP2009/004493, filed on Jun. 23, 2009.

(60) Provisional application No. 61/133,197, filed on Jun. 26, 2008.

(30) Foreign Application Priority Data

Jun. 26, 2008 (DE) .......................... 10 2008 029 970

(51) Int. Cl.
*G03B 27/42* (2006.01)
*G03F 7/20* (2006.01)

(52) U.S. Cl.
CPC .......... *G03F 7/7085* (2013.01); *G03F 7/70258* (2013.01); *G03F 7/70591* (2013.01)

(58) Field of Classification Search
CPC .............. G03F 7/7085; G03F 7/70258; G03F 7/70775; G03F 7/70591; G03F 7/70141; G03F 7/706; G03F 9/7026; G03F 7/70275; G03F 7/70308; G03F 7/70191; G03F 7/70208; G03F 7/70216; G02B 27/10; G02B 26/0875; G02B 27/0025; G02B 27/0043; G02B 5/3091
USPC ........................ 355/53, 67, 77; 372/38.02, 57
See application file for complete search history.

(56) References Cited

U.S. PATENT DOCUMENTS

| 4,596,467 A | 6/1986 | Bartelt |
| 4,728,193 A | 3/1988 | Bartelt et al. |

(Continued)

FOREIGN PATENT DOCUMENTS

| DE | 10109929 A1 | 11/2001 |
| DE | 102005056914 A1 | 5/2007 |

(Continued)

OTHER PUBLICATIONS

Haidenhain Prospectus "Linear encoders for Numerically Controlled Machine Tools", Jul. 2010, p. 11.

*Primary Examiner* — Mesfin T Asfaw
(74) *Attorney, Agent, or Firm* — Edell, Shapiro & Finnan, LLC

(57) ABSTRACT

A projection exposure system (10) for microlithography. The system includes projection optics (12) configured to image mask structures into a substrate plane (16), an input diffraction element (28) which is configured to convert irradiated measurement radiation (21) into at least two test waves (30) directed onto the projection optics (12) with differing propagation directions, a detection diffraction element (34; 28) which is disposed in the optical path of the test waves (30) after the latter have passed through the projection optics (12) and is configured to produce a detection beam (36) from the test waves (30) which has a mixture of radiation portions of both test waves (30), a photo detector (38) disposed in the optical path of the detection beam (36) which is configured to record the radiation intensity of the detection beam (36), time resolved, and an evaluation unit which is configured to determine the lateral imaging stability of the projection optics (12) from the radiation intensity recorded.

22 Claims, 7 Drawing Sheets

(56) References Cited

U.S. PATENT DOCUMENTS

| | | | |
|---|---|---|---|
| 4,772,119 A * | 9/1988 | Bouwhuis et al. | 356/124 |
| 4,991,962 A | 2/1991 | Jain | |
| 5,414,514 A | 5/1995 | Smith et al. | |
| 5,559,601 A | 9/1996 | Gallatin et al. | |
| 5,689,339 A | 11/1997 | Ota et al. | |
| 5,808,742 A | 9/1998 | Everett et al. | |
| 6,088,103 A | 7/2000 | Everett et al. | |
| 6,160,622 A | 12/2000 | Dirksen et al. | |
| 6,384,899 B1 | 5/2002 | den Boef | |
| 6,417,922 B1 * | 7/2002 | Dirksen et al. | 356/401 |
| 6,469,793 B1 | 10/2002 | Stanton | |
| 7,084,987 B2 | 8/2006 | Kreuzer | |
| 2001/0028462 A1 | 10/2001 | Ichihara et al. | |
| 2002/0001088 A1 | 1/2002 | Wegmann et al. | |
| 2002/0027648 A1 * | 3/2002 | Van Der Laan et al. | 355/71 |
| 2005/0046846 A1 | 3/2005 | Chandhok | |
| 2005/0117170 A1 | 6/2005 | Hasegawa | |
| 2005/0117171 A1 * | 6/2005 | Kato | 356/521 |
| 2005/0190376 A1 | 9/2005 | Wegmann et al. | |
| 2005/0190377 A1 * | 9/2005 | Ohkubo | 356/515 |
| 2005/0190378 A1 | 9/2005 | Nakauchi | |
| 2005/0200940 A1 | 9/2005 | Emer | |
| 2005/0280795 A1 | 12/2005 | Van Der Werf et al. | |
| 2006/0139598 A1 | 6/2006 | Van Dijsseldonk et al. | |
| 2006/0147820 A1 | 7/2006 | Colburn et al. | |
| 2006/0187435 A1 | 8/2006 | Ohsaki | |
| 2008/0128643 A1 * | 6/2008 | Mueller et al. | 250/559.01 |
| 2009/0002663 A1 | 1/2009 | Freimann et al. | |
| 2009/0091727 A1 | 4/2009 | Kwan | |

FOREIGN PATENT DOCUMENTS

| | | |
|---|---|---|
| EP | 1383007 A1 | 1/2004 |
| EP | 1598648 A2 | 11/2005 |
| JP | 2004134756 A | 4/2004 |
| JP | 2005244126 A | 9/2005 |
| WO | 2007062808 A1 | 6/2007 |
| WO | 2007074134 A1 | 7/2007 |
| WO | 2009089999 A1 | 7/2009 |

* cited by examiner

PROJECTION EXPOSURE SYSTEM FOR MICROLITHOGRAPHY AND METHOD OF MONITORING A LATERAL IMAGING STABILITY

This is a Continuation of International Application PCT/EP2009/004493, with an international filing date of Jun. 23, 2009, which was published under PCT Article 21(2) in English, which claims priority under 35 U.S.C. §119(a) to German Patent Application No. 10 2008 029 970.7, filed on Jun. 26, 2008, and the entire contents of which are hereby incorporated by reference; this application also claims the benefit under 35 U.S.C. §119(e)(1) of U.S. Provisional Application No. 61/133,197, filed on Jun. 26, 2008, the entire contents of which are also hereby incorporated by reference.

FIELD OF AND BACKGROUND TO THE INVENTION

The invention relates to a projection exposure system for microlithography. These types of projection exposure system generally have a mask holding device in the form of a mask table or of a so-called "reticle stage" for holding a mask or a so-called "reticle" with mask structures disposed on the latter. This type of projection exposure system generally further comprises a substrate holding device in the form of a so-called "wafer stage" for holding a substrate in the form of a wafer and projection optics for imaging the mask structures onto the substrate.

With conventional projection exposure systems the quality of the image often suffers from blurring. If the image position drifts over the wafer while exposing a field, the latent image is blurred in the photoresist. The effect of this is overlay errors in the printed structures. These blurring problems occur to a particularly large extent with EUV projection exposure systems. EUV projection exposure systems expose structures with light with a wavelength in the extreme ultraviolet wavelength range, e.g. with a wavelength of 13.5 nm. In the roadmap of the semiconductor industry optical lithography in the EUV plays a key role. Only mirrors are considered as optical components here. With mirror optics a change to the mirror position and/or the mirror tilt position leads first and foremost to a shift in the image. The requirements for the mechanical stability of the optical components are clearly tightened in comparison to refractive systems.

With conventional projection exposure systems the field position while exposing a wafer is controlled a number of times with appropriate adjustment and so-called "alignment" sensors, and appropriate corrective measures are introduced. For this purpose the actual exposure process of the photoresist is interrupted. Between the control measurements one relies upon the short-term stability of the projection system. In comparison with EUV systems, conventional systems have a relatively high level of short-term stability. The stability requirements for the image position when carrying forward the conventional image position control concept leads to an increase in the mechanical stability requirements in the image position from 1 nm with conventional systems to 0.2 nm with EUV systems over a period of 5 minutes. The thermal expansion of the mechanical base structure of the objective is a main error contribution for the stability of the mirror positions. In order to meet the demanded high requirements of image stability, one is currently taking the approach of using materials with extremely low thermal expansion coefficients for the structure of the projection objective. However, these types of material are extremely cost intensive, sensitive and difficult to process.

SUMMARY OF THE INVENTION

It is an object of the invention to address the aforementioned problems, and in particular to provide a projection exposure system wherein blurring of the latent image in the photoresist is largely prevented.

The aforementioned object can be achieved according to one formulation of the invention with a projection exposure system for microlithography which comprises: projection optics for imaging mask structures into a substrate plane and a measurement device which is configured to determine a lateral imaging stability of the projection optics with a resolution of better than 0.5 nm with a measuring speed of at least 10 Hz.

In this context the lateral imaging stability of the projection optics specifies to what extent the lateral position of the image of mask structures imaged into the substrate plane by the projection optics remains stable over time during the exposure operation of the projection exposure system. The lateral position of the image is understood as meaning the position of the latter in the substrate plane. Here the lateral imaging stability of the projection optics determined by the measurement device relates to the lateral shift of the image of the mask structures caused purely by the projection optics during the exposure operation.

However, determination of the lateral imaging stability is independent of the exposure operation of the projection exposure system and can also be determined in exposure pauses. Therefore, the lateral imaging stability of the projection optics defines the capability of the projection optics, to image mask structures stably into the substrate plane with regard to the lateral shift of the image of the mask structures. In other words, the measurement device can also be referred to as a so-called "line of sight" sensor with which the stability of the "line of sight" of a measurement beam through the projection optics is determined.

The specified resolution of the measurement of the imaging stability of better than 0.5 nm relates to the resolution with which the image stability in the substrate plane can be measured by the measurement device according to the invention. By measuring the imaging stability with the specified resolution with a measurement speed of at least 10 Hz, changes in the lateral position of the image of mask structures during the exposure operation of the projection exposure system can be measured with a high local and temporal resolution. This makes it possible to correct the lateral position of the image in real time while imaging the mask structures. For this purpose the measurement device is advantageously connected to control electronics of the exposure operation of the projection exposure system. The lateral position of the image of the mask structures can therefore be kept stable to a large degree during the exposure process, and so blurring of the latent image in the photoresist can largely be prevented.

In one embodiment according to the invention the resolution of the measurement device is better than 0.1 nm and in particular better than 30 pm. The measuring speed is at least 50 Hz, in particular at least 500 Hz, advantageously at least 2 kHz.

Furthermore, the aforementioned object can be achieved according to another formulation of the invention with a projection exposure system for microlithography which comprises: projection optics for imaging mask structures into a substrate plane, an input diffraction element which is configured to convert irradiated measurement radiation into at least two test waves directed onto the projection optics with differing propagation directions, and a detection diffraction element which is disposed in the optical path of the test waves after the latter have passed through the projection optics and is configured to produce a detection beam from the test waves which has a mixture of radiation portions of both test waves. The projection exposure system further comprises a photo detector disposed in the optical path of the detection beam which is configured to record the radiation intensity of the detection beam, time resolved, and an evaluation unit which is configured to determine the lateral imaging stability of the projection optics from the radiation intensity recorded.

Furthermore, according to yet another formulation of the invention a method is provided for monitoring a lateral imaging stability of projection optics of a projection exposure system for microlithography wherein measurement radiation is irradiated onto an input diffraction element such that the measurement radiation is converted into at least two test waves with differing propagation directions, which then pass through the projection optics, after passing through the projection optics the test waves strike a detection diffraction element and by diffraction a detection beam is thus produced which has a mixture of radiation portions of both test waves. Furthermore, the radiation intensity of the detection beam is recorded by a photo detector, time resolved, and from this the lateral imaging stability of the projection optics is established.

The test waves generated by the input diffraction element are spatially separate from each other in at least one plane of the projection optics (pupil). That means they are not individual portions of an overall contiguous wave. The test waves are rather individual waves. The test waves are configured such that due to the differing propagation directions of the test waves the system pupil of the projection optics is illuminated by the test waves in sections. In particular, the single sections of the pupil plane illuminated by the test waves are areas, which are separated locally from each other, i.e. the areas are do not form a contiguous area.

In other words, according to one aspect of the invention, the projection optics have test waves radiated through them on different paths. After having passed through the projection optics, the detection diffraction element converts the test waves into at least one detection beam which has radiation portions of both test waves. The detection beam is then irradiated onto a photo detector which records the whole radiation intensity of the detection partial beam, time resolved. The lateral imaging stability of the projection optics is established from the radiation intensity recorded. Changes in the lateral imaging property of the projection optics can therefore be observed with a high degree of precision in real time.

The intensity on the photo detector is periodic in relation to a lateral shift of the diffraction elements, i.e. a shift of the input diffraction element and/or the detection diffraction element laterally to the optical path of the measurement radiation. Correspondingly, the detector intensity is also periodic in relation to a lateral shift of the test waves over the detection diffraction element, or in other words a lateral shift of the "image". Therefore, the signal of the photo detector is only distinct as far as the periodicity. The periodicity of the diffraction elements is therefore advantageously configured to be clearly larger than the desired measurement range aimed for. For example, grating periods of several 100 nm to several µm with a desired for measurement range of approximately 10 nm is used.

With this measurement method and a projection exposure system configured in this way it is possible to measure the lateral imaging stability of projection optics with the aforementioned resolution at the specified measuring speed. Therefore, as explained above, the lateral position of the image of the mask structures is kept stable to a large extent during the exposure process.

In an embodiment according to the invention, the irradiated measurement radiation is converted by the input diffraction element in at most twenty test waves, in particular two, three or four test waves, directed onto the projection optics with differing propagation directions.

In a further embodiment according to the invention the test waves each have a non-spherical wave front. According to one variation, the test waves are configured as Gaussian beams or similar to Gaussian beams. According to certain embodiments the respective test waves have plane wave fronts or virtually plane wave fronts.

According to some embodiments the test waves each comprise a radiation portion of the irradiated measurement radiation, which is generated by diffraction at the input diffraction element in at least the first diffraction order, that means the first or a higher diffraction order.

The input diffraction element and/or the detection diffraction element can respectively be in the form of a grating structure. With the embodiment as a grating structure it is advantageous if the measurement process is carried out twice, the orientation of the grating structures being rotated about 90° with the second measurement in order to be able to determine the lateral imaging stability two-dimensionally in the substrate plane. Alternatively, the input diffraction element and/or the detection diffraction element can also respectively be in the form of a hologram structure. A hologram structure of this type can be configured such that the diffracted beams produced in this way allow the lateral imaging stability measurement in both dimensions of the substrate plane. The photo detector serves as an intensity sensor and can, for example, be configured in the form of a photodiode.

In a further embodiment according to the invention the input diffraction element is disposed on the mask side or the object side, and the detection diffraction element on the substrate side or on the image side in relation to the projection optics. Therefore, in this embodiment the input diffraction element and the detection diffraction element are in the form of two separate diffraction elements. With the aforementioned arrangement of the diffraction elements, the measurement radiation passes through the projection optics in the same direction as the exposure radiation during the exposure operation of the projection exposure system. In a further embodiment the input diffraction element is disposed on the substrate side and the detection diffraction element on the mask side, and so the optical path is inverted.

In a further embodiment according to the invention an illumination diffraction element is furthermore provided which is disposed in the optical path of the measurement radiation in front of the input diffraction element and is configured to convert the measurement radiation into at least two measurement radiation partial beams with differing propagation directions. In particular, the measurement radiation is converted into three measurement radiation partial beams which are formed by the −1st, 0th and +1st diffraction order of the illumination diffraction element. By splitting the measurement radiation before the latter strikes the input diffraction element, by using the input diffraction element, a larger number of test waves can be produced. Like the input diffraction element and the detection diffraction element, the illumination diffraction element can be designed, for example, as a grating structure or as a hologram structure.

In a further embodiment according to the invention an imaging optical element is further provided which is disposed between the illumination diffraction element and the input diffraction element in order to direct the measurement radiation partial beams onto the input diffraction element. It is thus made possible for the measurement radiation partial beams to all be directed onto a common point of the input diffraction element, and so the subsequently produced test waves all have the same origin.

In a further embodiment according to the invention the illumination diffraction element and the input diffraction element are configured such that each of the at least two measurement radiation partial beams coming from the illumination diffraction element is converted into at least two diffraction individual beams by diffraction on the input diffraction element, at least one of the diffraction individual beams produced by diffracting a first of the measurement radiation partial beams being overlaid by one of the diffraction individual beams produced by diffracting the second of the measurement radiation partial beams such that the overlaid diffraction individual beams together form one of the test waves. The respective diffraction individual beams of the individual measurement radiation partial beams are produced in particular by diffracting the respective measurement radiation partial beam on the input diffraction element in at least two of the diffraction orders including the −1st, 0th and +1st order. With the overlaying, the intensity and the phase position of the test wave specified can be set such that the evaluation of the detection partial beam or rather a number of detection partial beams recorded can be optimised.

In a further embodiment according to the invention the detection diffraction element is configured such that in addition to the first detection beam at least a second and a third detection beam are produced from the test waves, the second detection beam having at least one radiation portion of a first of the two test waves and the third detection beam having at least one radiation portion of the second of the two test waves, and the projection exposure system having at least two further photo detectors for recording the respective radiation intensity of the second detection beam and of the third detection beam. The intensity measurement of the further detection beams, which can also be called detection partial beams, enables standardisation of the measured intensity of the first detection beam. As already explained above, the signal of the first photo detector is only definite as far as the periodicity. Using the further detection beams the interpolation within the period is facilitated. The signals of the individual photo detectors are still periodic in relation to translation of the gratings and of the lateral position of the test waves on the detection diffraction element, but respectively offset in relation to one another by a fraction of the period of the detection diffraction element. The diffraction elements can also be configured such that the detector signals are of different forms (e.g. harmonic waves) during lateral shifting.

In a further embodiment according to the invention an exposure radiation source for producing radiation for imaging the mask structures into the substrate plane and a measurement radiation source independent of the exposure radiation source for producing the measurement radiation are furthermore provided. In particular, the wavelength of the measurement radiation source is within the infrared, visible or near UV range, whereas the wavelength of the exposure radiation source can be e.g. within the EUV wavelength range.

In a further embodiment according to the invention the projection exposure system has an exposure optical path for imaging the mask structures into the substrate plane and a coupling mirror for coupling, on the mask side, the measurement radiation into the exposure optical path.

In a further embodiment according to the invention the projection exposure system has an exposure optical path for imaging the mask structures into the substrate plane and an uncoupling mirror for uncoupling the test waves from the exposure optical path. With the positioning on the substrate side of the at least one photo detector, the uncoupling mirror is advantageously also disposed on the substrate side.

According to a further embodiment according to the invention the input diffraction element and the detection diffraction element are formed by the same diffraction element and the projection exposure system has a retro-reflector with which the test waves are reflected back on themselves after passing through the projection optics so that the test waves pass through the projection optics once again and then strike the detection diffraction element. Therefore, the projection optics are tested in the double passage of the measurement radiation. The double passage makes it possible to increase the resolution of the stability measurement. Furthermore, installation space for the measurement technology is only required on one side of the projection optics. Therefore, no structural changes need be made to the projection exposure system by the measurement device on the other side. A Littrow diffraction grating, a spherical mirror or a prism in the form of so-called "corner cubes" can e.g. be used as a retro-reflector.

According to a further embodiment of the invention the projection optics are formed by mirrors and individual regions of the surfaces of the mirrors which, when measuring the lateral imaging stability are irradiated by the test waves, are provided with a reflective coating designed according to the wavelength of the measurement radiation. The intensity loss of the test waves in the projection optics is thus reduced and so the quality of the measurement signal is improved. The cross-sections or so-called "footprints" of the measurement radiation on the surfaces of the mirrors can, in particular partially, lie outside of the "footprints" of the exposure radiation.

In a further embodiment the projection exposure system according to the invention is configured to image the mask structures with light in the extreme ultraviolet (EUV) and/or higher frequency wavelength range into the substrate plane. Light in the EUV wavelength range can have, for example, a wavelength of 13.5 nm. In one embodiment according to the invention the individual mirrors of the projection optics are provided with a coating which reflects well both at the EUV wavelength and at the wavelength of the measurement radiation.

The features specified in relation to the above embodiments and variants of the projection exposure system according to the invention can correspondingly be transferred to the method according to the invention. The resulting embodiments of the method according to the invention should be explicitly included by the disclosure of the invention. Furthermore, the advantages listed above in relation to the embodiments of the projection exposure system according to the invention therefore also relate to the corresponding embodiments of the method according to the invention.

BRIEF DESCRIPTION OF THE DRAWINGS

In the following exemplary embodiments of the projection exposure system for microlithography according to the invention and of the method according to the invention are described in greater detail with reference to the attached diagrammatic drawings. These show as follows.

DETAILED DESCRIPTION OF EXEMPLARY EMBODIMENTS ACCORDING TO THE INVENTION

In the exemplary embodiments described below, elements which are similar to one another functionally or structurally are provided as far as possible with the same or similar reference figures. Therefore, in order to understand the features of the individual elements of a specific exemplary embodiment, one should refer to the description of other exemplary embodiments or to the general description of the invention.

Figure 1:
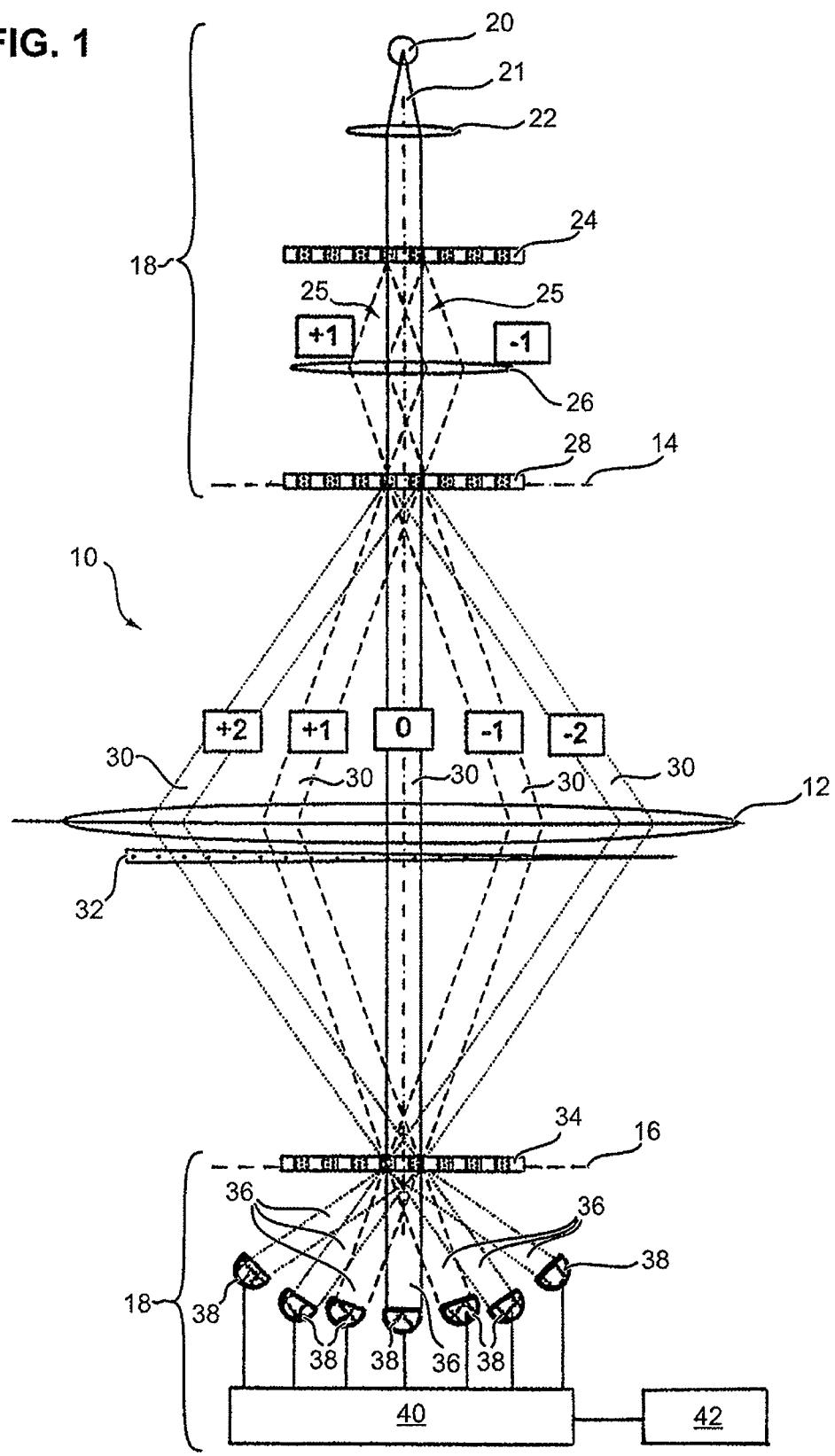
FIG. 1 a diagrammatic sectional view of a first embodiment of a projection exposure system according to the invention with projection optics and a measurement device for determining a lateral imaging stability of the projection optics, FIG. 2 an illustration of a measurement optical path in the projection exposure system according to FIG. 1, FIG. 3 the section on the mask side of the projection exposure system according to the invention in a further embodiment according to the invention, FIG. 4 the section on the mask side of the projection exposure system according to the invention in a further embodiment according to the invention, FIG. 5 the section on the substrate side of the projection exposure system according to the invention in a further embodiment according to the invention, FIG. 6 the section on the substrate side of the projection exposure system according to the invention in a further embodiment according to the invention, FIG. 7 a diagrammatic side view of a second embodiment of the projection exposure system according to the invention with a retro-reflector, FIG. 8 the projection exposure system according to FIG. 7 in a further embodiment according to the invention, FIGS. 9a and 9b an illustration of the mode of operation of the retro-reflector according to FIGS. 7 and 8, and FIGS. 10a and 10b the projection exposure system according to FIG. 7 in a further embodiment according to the invention.

FIG. 1 illustrates a first embodiment of a projection exposure system 10 according to the invention for microlithography, e.g. in the form of an EUV projection exposure system designed as a so-called "scanner". The projection exposure system 10 is configured to image mask structures on a mask, not illustrated by the drawing of FIG. 1, using projection optics 12 onto a substrate in the form of a so-called "wafer" disposed in a substrate plane 16. For this purpose the projection exposure system 10 comprises a mask shifting table in the form of a so-called "reticle stage" and a substrate shifting table in the form of a so-called "wafer stage".

Figure 3:
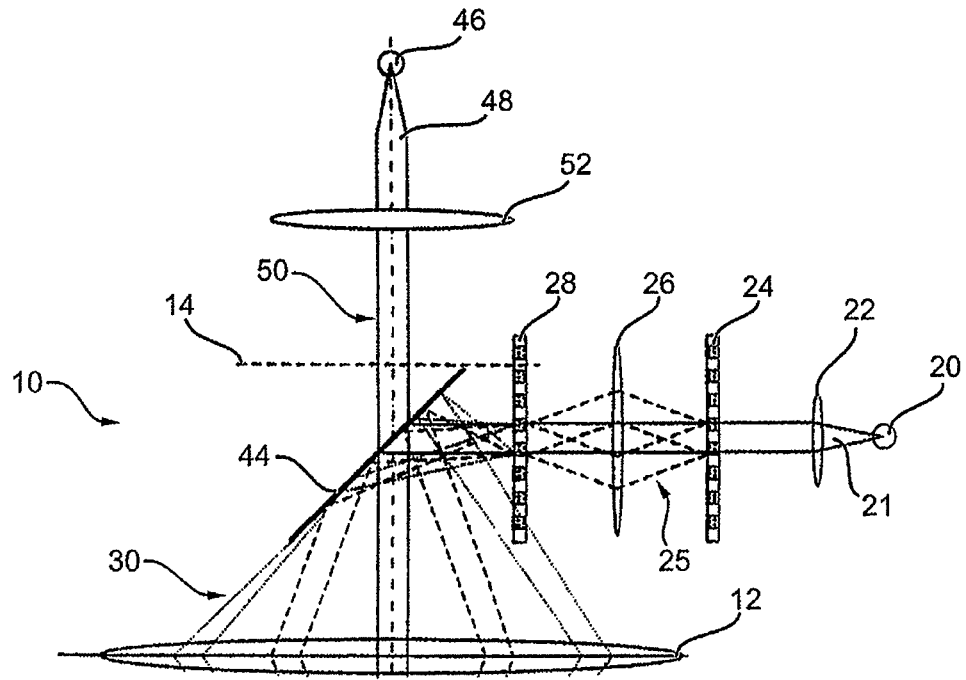

For this purpose the projection exposure system 10 comprises an exposure radiation source 46 shown e.g. in FIG. 3, for example in the form of an EUV radiation source for producing extreme ultraviolet exposure radiation 48 with a wavelength of 13.5 nm, and illumination optics 52 for illuminating the mask with the exposure radiation 48.

The projection optics 12 comprise a number of optical elements. In the case where the projection exposure system 10 is operated with exposure radiation 48 in the EUV wavelength range, the projection optics 12 are designed catoptrically and only comprise reflective optical elements in the form of mirrors.

The projection exposure system 10 further comprises a measurement device 18 for determining the lateral imaging stability of the projection optics 12. In this context the lateral imaging stability of the projection optics 12 specifies, as already explained above, to what extent the lateral position of the image of structures imaged with the projection optics 12 from the mask plane 14 into the substrate plane 16 during the exposure operation of the projection exposure system 12 remains stable over time. Therefore, the lateral imaging stability defines the capability of the projection optics 12 to image mask structures into the substrate plane 16 stably with regard to the lateral shift of the image of the mask structures in the substrate plane 16.

In other words, the measurement device 18 determines a lateral shift of the image of the projection exposure system 10 which takes place due to the aberrations in the projection optics 12. In terms of a wavefront error a tilt of the wavefront is detected. For this purpose, a measurement optical path is provided which either replaces the exposure or imaging optical path temporarily, is coupled to or uncoupled from the imaging optical path or samples a part of the projection optics 12 not used by the exposure optical path, the properties of which are representative of the whole projection optics 12.

The measurement device 18 comprises a measurement radiation source 20 for producing measurement radiation 21. The measurement radiation 21 can comprise electromagnetic radiation in the infrared, visible or ultraviolet wavelength range, e.g. with a wavelength of 1064 nm, 780 nm, 632 nm, 532 nm, 365 nm, 248 nm or 193 nm. In the case where the projection exposure system 10 is configured as an EUV exposure system, in one embodiment according to the invention the individual mirrors of the projection optics 12 are provided with a coating which reflects well both with the EUV wavelength and with the wavelength of the measurement radiation 21.

In one embodiment according to the invention the measurement radiation 21 can have the same wavelength as the exposure radiation for imaging the mask structures. In this case, the measurement radiation source 20 can correspond to the exposure radiation source 46.

The measurement device 18 according to FIG. 1 further comprises a collimator 22, an optional illumination diffraction element in the form of an illumination diffraction grating 24, an optional imaging optical element 26 and an input diffraction element in the form of an input diffraction grating 28. The collimator 22 focuses the measurement radiation 21 onto the illumination diffraction grating 24, from which the measurement radiation 21 is converted by diffraction into three measurement radiation partial beams 25 with differing propagation directions. The individual measurement radiation partial beams 25 are formed by the radiation diffracted into the 0th, −1st and +1st diffraction order. The measurement radiation partial beams 25 then strike the input diffraction grating 28 disposed in the mask plane 14. From the latter the radiation of the individual measurement radiation partial beams 25 is diffracted once again, by which five so-called test waves 30, also referred to as test partial beams, are formed.

Figure 2:
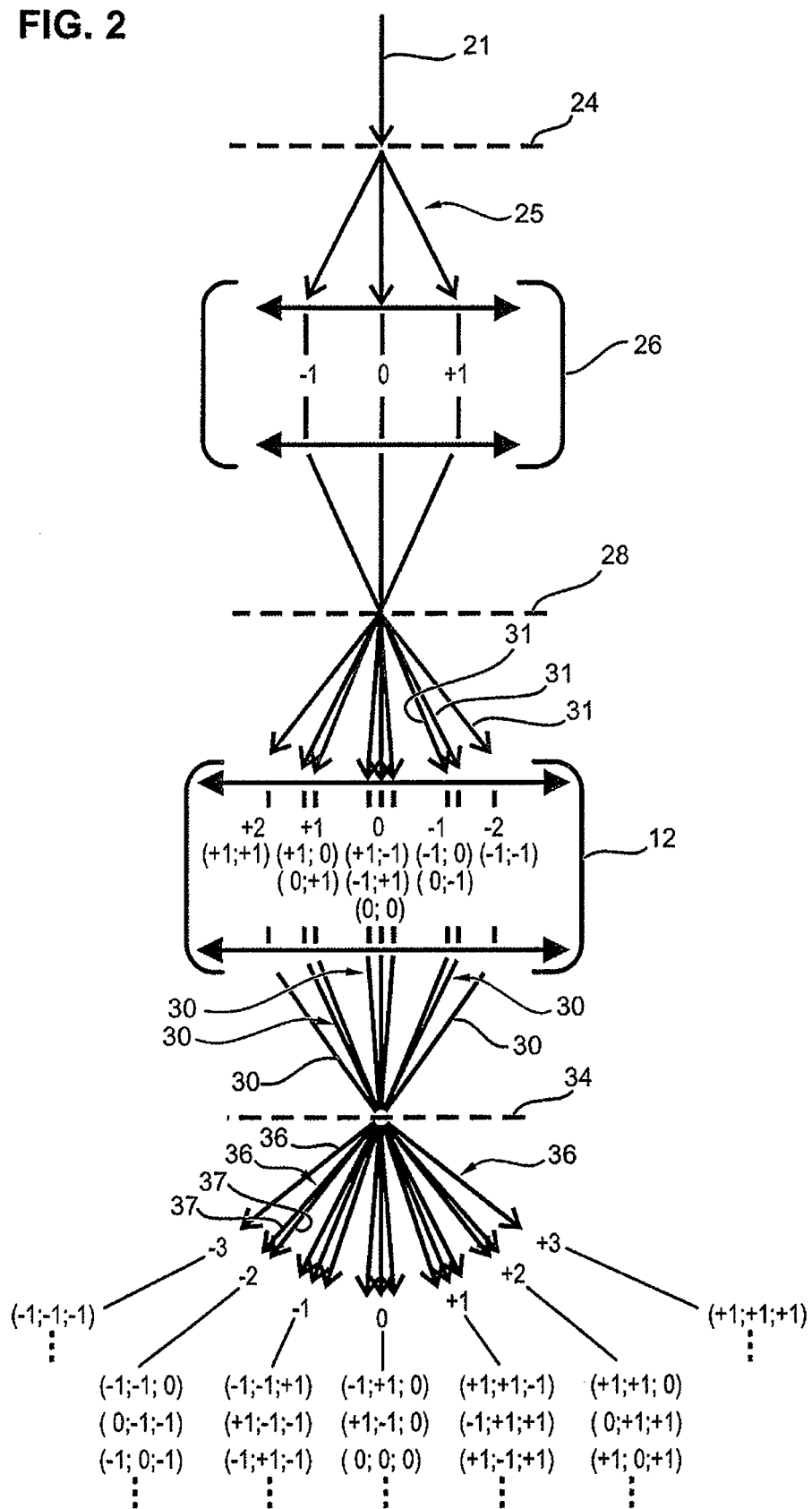

As illustrated in FIG. 2, the test waves 30 are respectively formed from a number of diffraction individual beams 31. For example, the test wave 30 identified by "0" comprises the following three diffraction individual beams 31: (+1, −1), (−1, +1) and (0, 0). Here the first figure in the bracket characterising one respective test wave 30 indicates the diffraction order of the associated measurement radiation partial beam 25 and the second figure the diffraction order when diffracting this measurement radiation partial beam 25 on the input diffraction grating 28 in order to produce the respective diffraction individual beam 31. The test wave 30 identified by "+1" comprises the following diffraction individual beams 31: (+1, 0) and (0, +1). Furthermore, the diffraction individual beam (−1, +2), for example, can also contribute to the formation of this test wave 30.

For the basic function of the method according to the invention it is essential that at least two test waves 30 with differing propagation directions pass through the projection optics 12. After passing through the projection optics 12 the test waves 30 strike a detection diffraction element in the form of a detection diffraction grating 34 on which the test waves 30 are converted by diffraction into the detection partial beams 36 identified by "−3" to "+3".

Analogously to the test waves 30, the detection partial beams 36 are formed from diffraction individual beams 37. Therefore, for example, the detection partial beam 36 identified by "−2" comprises the following three diffraction individual beams 37: (−1, −1, 0), (0, −1, −1) and (−1, 0, −1). Here the first figure in the brackets characterising one respective detection partial beam 36 indicates the diffraction order of the associated measurement radiation partial beam 25, the second figure indicates the diffraction order of the associated test wave 30, and the third figure indicates the diffraction order of the diffraction individual beam 37 produced by diffracting this test wave 30 on the detection diffraction grating 34. Furthermore, the diffraction individual beams (−1, −2, +1), (−1, +1, −2), etc. for example can also contribute to the formation of the test partial beam 30 identified by "−2".

The measurement device 18 further comprises for each of the detection partial beams 36 a photo detector in the form of a photodiode 38. The photodiodes 38 record the development over time of the respective intensity of the individual detection partial beams 36. The intensity signals recorded by the photodiodes 38 correlate to the lateral shift of the illumination diffraction grating 24, to the lateral shift of the input diffraction grating 28, to the lateral shift of the detection diffraction grating 34 and to the lateral image shift in the substrate plane 16 which is brought about by the wavefront tilt 32 of the projection optics 12.

If one holds the illumination diffraction grating 24, the input diffraction grating 28 and the detection diffraction grating 34 sufficiently securely, the lateral image shift going back to the projection optics 12 and so the lateral imaging stability of the projection optics 12 can thus be measured from the intensity signals recorded.

This is implemented by reading out the intensity signals from the photodiodes 38 via a read-out unit 40 and a corresponding evaluation of the intensity signals with an evaluation unit 42. In order to be able to determine the lateral imaging stability, the intensity of at least a first detection partial beam 36 must be read out which has a mixture of radiation portions of at least two test waves 30. This is the case, for example, for the detection partial beam 36 characterised by "−1" which has diffraction individual beams 37 going back to at least two test waves 30, for example: (−1, −1, +1) and (−1, +1, −1).

Furthermore, in one advantageous embodiment the respective intensity of at least two further detection partial beams 36 is recorded, one of these detection partial beams 36 comprising at least one radiation portion of a first of the aforementioned two test waves 30, and the other detection partial beam 30 comprising at least one radiation portion of the second of the aforementioned test waves 30. Therefore, standardisation of the measured intensity of the first detection partial beam 36 can take place. As already explained above, the signals of the photo detectors 38 are only definite as far as the grating period. The interpolation within the grating period is facilitated by the further detection beams. The signals of the individual photo detectors 38 are still periodic in relation to translation of the gratings and the lateral position of the test waves 30 on the detection diffraction grating 34, but respectively offset in relation to one another by a fraction of the period of the detection diffraction grating 34.

The design of the gratings 24, 28 and 34 with regard to the grating period, grating shape, blaze angle, phase range and position in the optical path is such that photodiode signals are produced which can be further processed electronically. With an electronic evaluation of the photodiode signals measurement accuracy is achieved which is better than the grating period of the detection diffraction grating 34 by at least three to four orders of magnitude. The measurement signal is always available while the measurement radiation source 20 is in operation. It is not linked to a movement in the imaging system such as e.g. a scan movement of the wafer stage or to the provision of exposure radiation 48 by the exposure radiation source 46 of the projection exposure system 10.

The input diffraction grating 28 and the detection diffraction grating 34 do not have to, as shown in FIG. 1, be disposed exactly in the mask plane 14 or the substrate plane 16. The gratings 28 and 34 also do not have to be conjugated exactly to one another. A defocus can be useful for optimisation of the signals of the photodiodes 38. In one embodiment according to the invention not shown in the drawings, the measurement optical path is inverted, i.e. the input diffraction grating 28 is disposed on the substrate side and the detection diffraction grating 34 is disposed together with the photodiodes 38 on the substrate side.

The evaluation unit 42 converts the determined lateral imaging stability of the projection optics 42 into a control signal which is relayed to the control electronics of the projection exposure system 10. Upon the basis of this control signal the control electronics correct the lateral position of the image during the exposure process in real time so that the lateral position of the mask structures imaged onto the substrate remain stable to a large extent.

With the measurement device 18 according to the invention it is possible, in particular, to determine the lateral imaging stability of the projection optics 12 with a resolution of better than 30 pm with a measuring speed of at least 2 kHz. Therefore, the lateral position of the image of the mask structures can be corrected with a very high repetition rate and accuracy during the exposure.

FIG. 3 shows the section on the mask side of the projection exposure system 10 according to FIG. 1 in a first embodiment according to the invention. According to this embodiment the measurement radiation 21 is coupled in the form of the test waves 30 using a coupling mirror 44 into an exposure optical path 50 of the projection exposure system 10. The exposure optical path 50 guides the exposure radiation 48 produced by the exposure radiation source 46. During the exposure operation of the projection exposure system 10 the exposure radiation 48 is irradiated via illumination optics 52 onto a product mask disposed in the mask plane 14 in order to image mask structures disposed on the latter into the substrate plane 16. The coupling of the measurement radiation 21 into the exposure optical path 50 using the coupling mirror 44 takes place in the embodiment illustrated in FIG. 3 at a point between the mask plane 14 and the projection optics 12 such that the exposure optical path 50 is not interfered with. The gratings 24 and 26 are disposed, like the measurement radiation source 20, outside of the exposure optical path 50.

Figure 4:
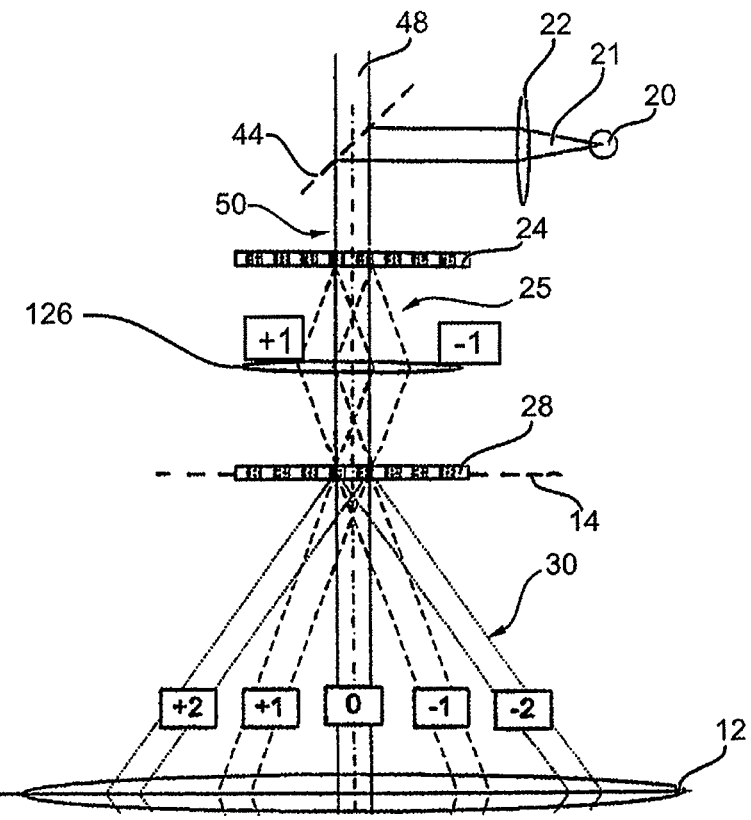

FIG. 4 shows a further embodiment of the section on the mask side of the projection exposure system 10. Here, after passing through the collimator 22, the measurement radiation 21 is coupled into the exposure optical path 50 at a point disposed in the optical path of the exposure radiation 48 in front of the mask plane 14. Here too the coupling of the measurement radiation 12 into the exposure optical path 50 is implemented such that the exposure optical path 50 is not interfered with. The gratings 24 and 28 are disposed here in the exposure optical path 50, the imaging optical element 126 disposed between being part of the illumination optics of the projection exposure system 10.

Figure 5:
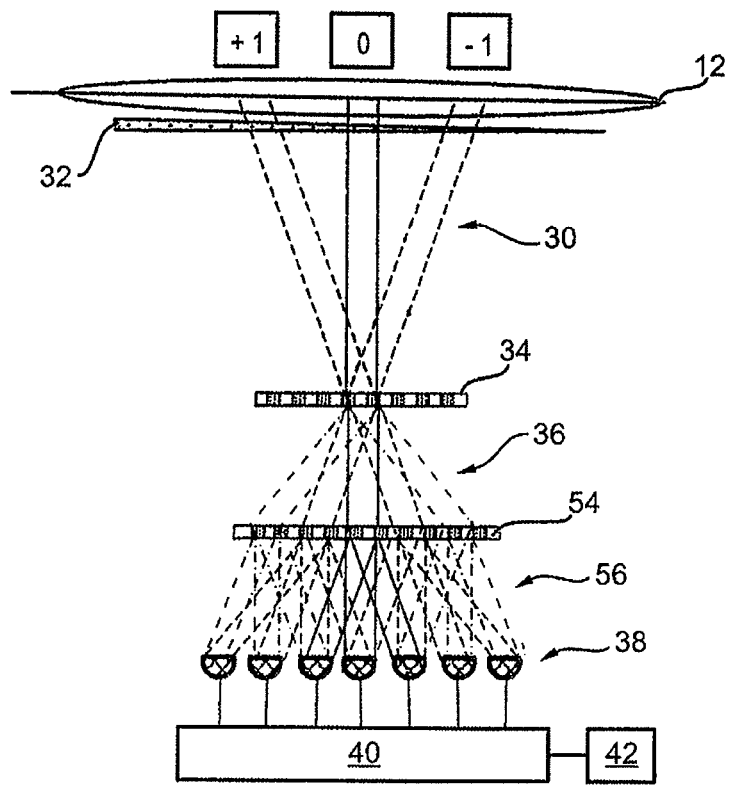

FIG. 5 shows the section on the substrate side of the projection exposure system 10 in a further embodiment according to the invention. In this embodiment an additional grating 54 is disposed downstream of the detection diffraction grating 34 for the coherent superposition of the test waves 30. On the mask side the illumination diffraction grating 24 can then be omitted. In this case only three test waves 30 pass through the projection optics 12. On the detection diffraction grating 34, in the same way as in the methodology illustrated with reference to FIG. 2, splitting of the three test waves 30 into five detection partial beams 36 and on the additional grating into seven prepared detection partial beams 56 takes place.

Figure 6:
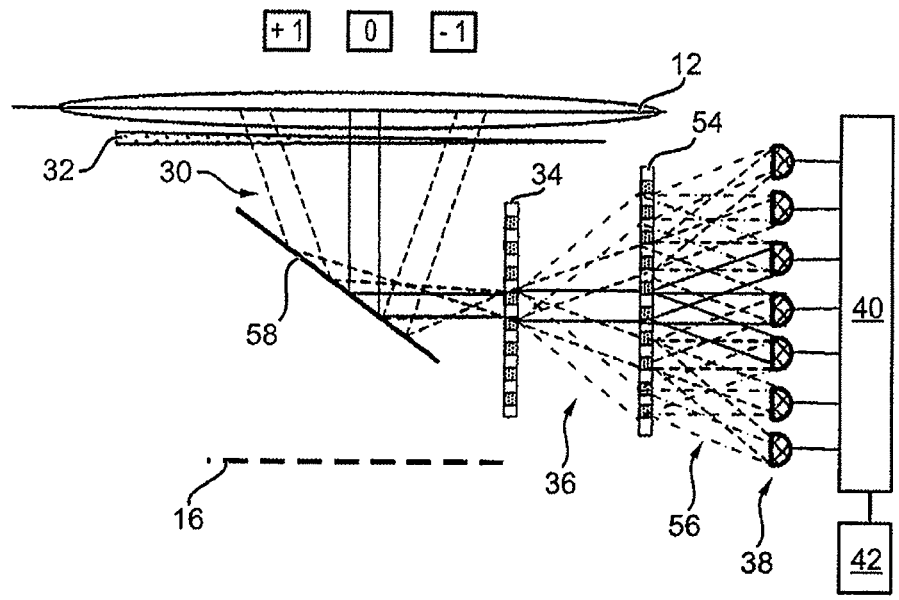

FIG. 6 shows a further embodiment of the configuration of the section on the substrate side of the projection exposure system 10. According to this embodiment the measurement radiation 21 in the form of the test waves 30 is uncoupled using an uncoupling mirror 58 from the exposure optical path 50 of the projection exposure system 10 in front of the substrate plane 16. This makes it possible to integrate the measurement device 18 into the projection exposure system 10 without any adverse effect upon the structure in the region of the substrate table or of the so-called "wafer stage".

Figure 7:
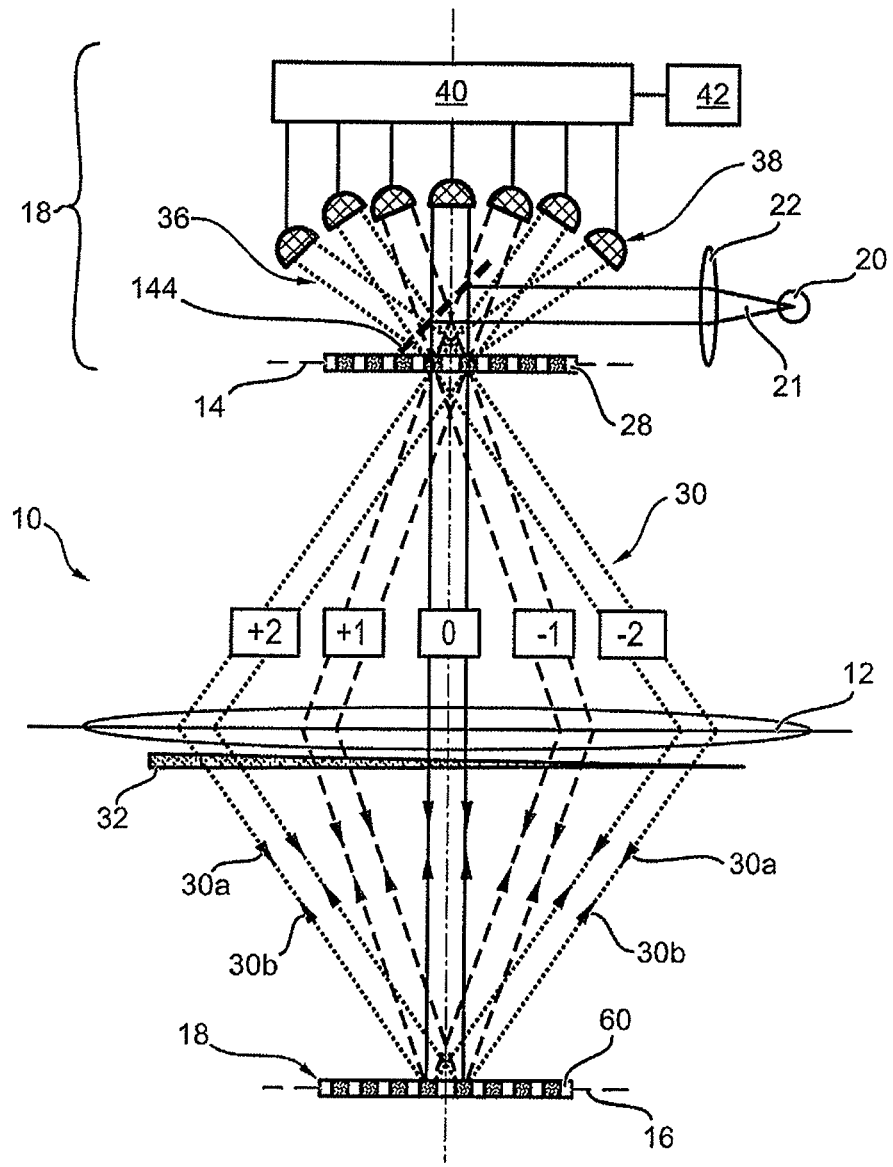

FIG. 7 shows a further embodiment of the projection exposure system 10 according to the invention wherein the test waves 30 pass through the projection optics 12 with a double passage. For this purpose a retro-reflector 60 is disposed in the substrate plane 16 with which after having passed through the projection optics 12, the test waves 30, referred to in the following as incoming test waves 30a, are reflected back on themselves. Therefore, the test waves 30 pass through the projection optics 12 as backwards running test waves 30b along the same path as the incoming test waves 30a. In a further version of the embodiment according to FIG. 7, in the same way as the version according to FIG. 6, an uncoupling and coupling mirror is disposed on the substrate side in order to uncouple the incoming test waves 30a from the exposure optical path of the projection exposure system and for coupling the backwards running test waves 30b into the exposure optical path. Similarly to the detection diffraction grating 34 according to FIG. 6, in this embodiment the retro-reflector 60 is disposed to the side of the exposure optical path.

The measurement radiation 21 is coupled by a partially transmissive coupling mirror 144 into the exposure optical path. The detection partial beams 36 produced from the backwards running test waves 30b are partially transmitted by the coupling mirror 144 so that the latter can be recorded by the photodiodes 38. The input diffraction grating 28 is also used in the reverse passage as a detection diffraction grating.

Figure 10A:
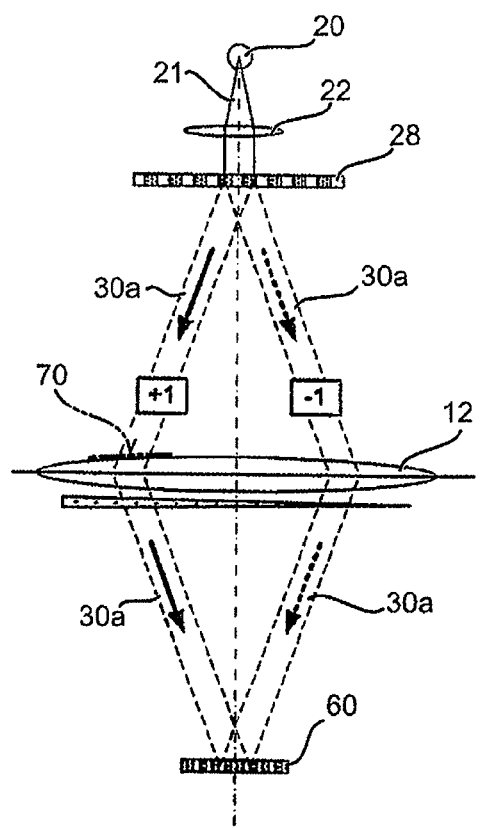
Figure 10B:
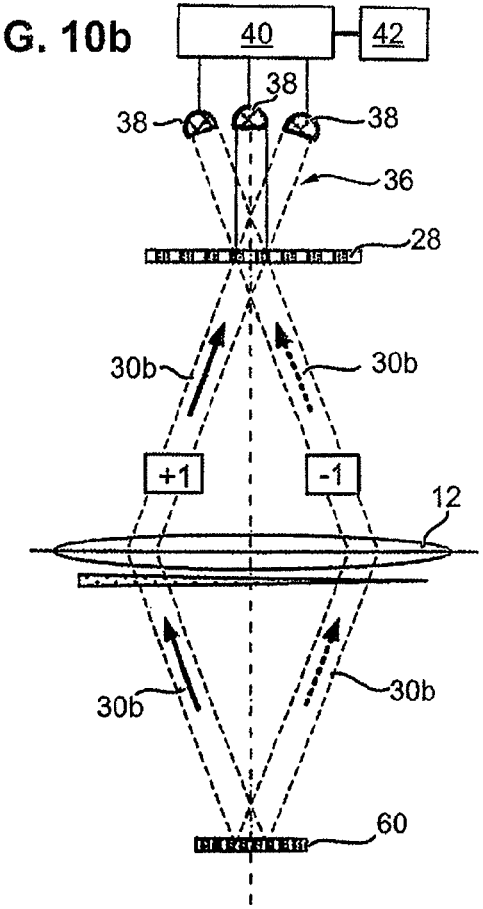

FIG. 10a illustrates the optical path of the measurement radiation 21 passing to the retro-reflector 60 extending from the measurement radiation source 20 to the retro-reflector 60 and FIG. 10b illustrates the optical path of the backwards running measurement radiation 21 extending from the retro-reflector 60 to the detectors 38. Here an embodiment is shown which manages with the minimum number of test waves 30, i.e. two test waves.

The retro-reflector 60 is designed in the form of a Littrow grating which, scale corrected, has half the period of the diffraction grating 28 on the object side. Moreover, only three detectors 38 are provided for recording the intensities of the detection partial beams 36. This embodiment can be used if there is only very little space available for the optical path of the measurement device 18. This is the case in particular with EUV systems.

The reflectivities of multiple layers and so-called "multi-layer" layers applied for the reflection of EUV radiation onto the mirrors of the projection optics 12 are so small for the wavelength of the measurement radiation 21 with approximately 0.6 that after the double passage of the measurement radiation 21 through a 4 mirror system, only very slight intensity comes back. This problem is resolved according to the invention by working with the minimum number of test waves 30. The cross-sections, or so-called "footprints" of the partial beams on the mirrors are then relatively small and are provided with a reflective coating 70 optimised to the wavelength of the measurement radiation 21.

The reflection in the substrate plane 16 is not implemented with a flat mirror because then the sensor would have no effect. The retro-reflector 60 ensures that the wavefront tilt effects the image offset two times and does not cancel out as with simple mirroring. As already stated above and illustrated e.g. in FIG. 7, the retro-reflector 60 can be in the form of a Littrow diffraction grating. Alternatively, a spherical mirror in the cat's eye position or a retro-reflector based on a prism in the form of so-called "corner cubes" can be used.

Figure 8:
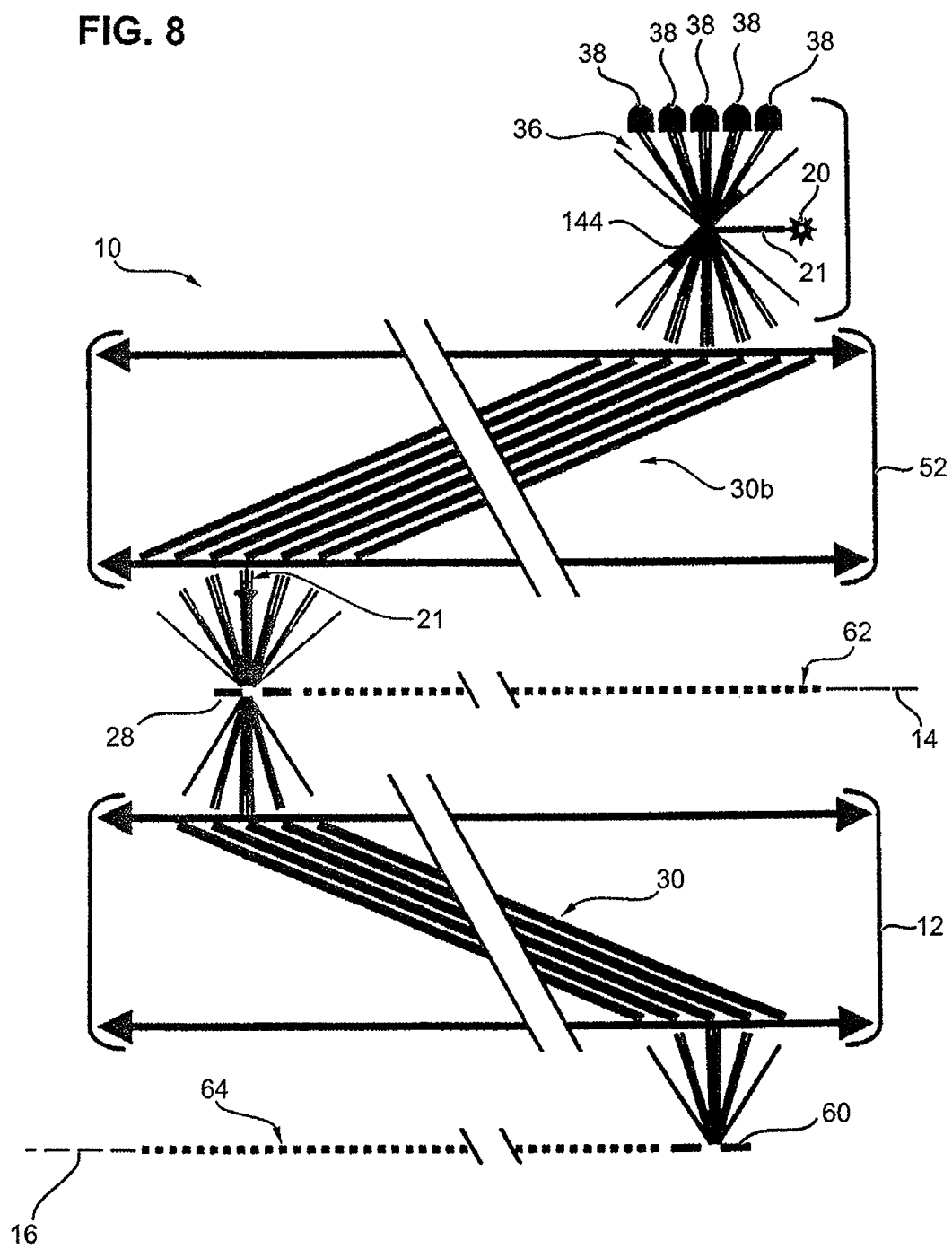

A Littrow diffraction grating can be written directly onto the wafer, as illustrated in the embodiment according to FIG. 8. This embodiment differs from the embodiment according to FIG. 7 in that illumination optics 52 for the exposure radiation are disposed between the coupling mirror 144 and the diffraction grating 28. The diffraction grating 28 is disposed on a peripheral region of a product mask 62.

Figure 9A:
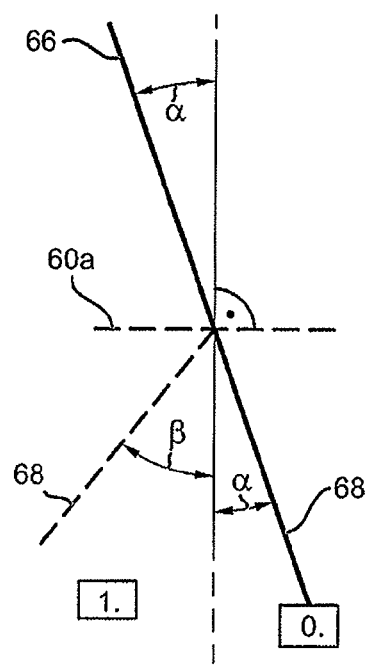
Figure 9B:
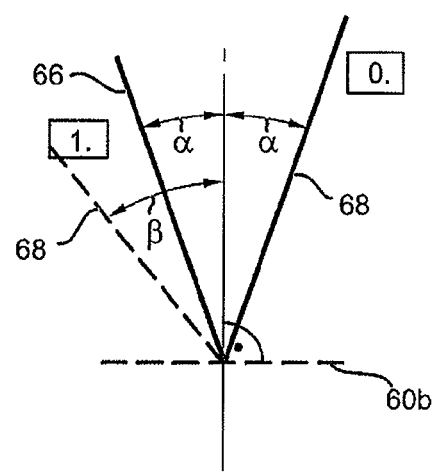

FIGS. 9a and 9b illustrate the mode of operation of the retro-reflector 60 according to FIG. 7 in the form of a Littrow grating. For this purpose, in FIG. 9a a transmission grating 60a and in FIG. 9b a reflection grating 60b is shown. With a Littrow grating the grating period, wavelength and diffraction order are correlated. In accordance with the diffraction formula with a non-perpendicular incidence $$\sin\alpha + \sin\beta = \frac{m \cdot \lambda}{p_B} \quad (1)$$

the correlation emerges between angle $\alpha$ of the incoming beam 66 to the grating normal and angle $\beta$ of the outgoing beam 68 diffracted in the first order to the grating normal with wavelength $\lambda$, grating period $p_B$ and diffraction order m. With a reflection grating shown in FIG. 9b the outgoing beams 68 are folded upwards. Therefore, for all of the incoming test waves 30a it is possible for the respective diffracted beam 30b to pass back precisely into the corresponding incident beam 30a.

For this purpose the following must be fulfilled: $\alpha=\beta$, i.e.

$$\sin\alpha = \sin\beta, \quad (2)$$

$$\text{where } \sin\alpha = \frac{m \cdot \lambda}{2p_B} \quad (3)$$

If the angle spectrum corresponds to the diffraction pattern on a grating 28 on the object or mask side with a grating period $p_O$ with a perpendicular incident:

$$\sin\alpha = \frac{m \cdot \lambda}{p_O} \quad (4)$$

it follows that the reflective Littrow grating 60 must have half the period of the equivalent grating on the object side:

$$p_B = \frac{p_O}{2} \quad (5)$$

The retroreflection of the optical path is then automatically guaranteed for the whole order.

In the embodiment according to FIG. 7 the grating 28 on the object side is passed through twice with the measurement optical path, which increases the measuring accuracy. It is furthermore possible for incident and outgoing beams to be slightly offset in relation to one another in the mask plane 14. This can take place by defocus and tilting of the Littrow grating 16 or use of a prism or mirror retro-reflector. The grating 28 can then be written differently for the incoming measurement radiation 21 and the backwards running test waves 30*b*.

The diffraction elements 24, 28, 24 and 54 shown in FIGS. 1 to 10 can also be in the form of hologram structures instead of gratings.

The above description of the exemplary embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A projection exposure system for microlithography comprising:
   projection optics arranged to image mask structures into a substrate plane,
      an input diffraction element configured to convert irradiated measurement radiation into at least two test waves directed onto the projection optics with differing propagation directions, such that a system pupil of the projection optics is illuminated by the at least two waves in areas which are separated locally from each other,
   a detection diffraction element disposed in the optical path of the test waves after the test waves have passed through the projection optics, and configured to produce a detection beam from the test waves which has a mixture of radiation portions of the at least two test waves, and
   a photo detector disposed in the optical path of the detection beam and configured to record the time-resolved radiation intensity of the detection beam, and an evaluation unit configured to determine a lateral imaging stability of the projection optics from the radiation intensity recorded, wherein the lateral imaging stability comprises an ability of the projection optics to image mask structures stably into the substrate plane with regard to a lateral shift of the image of the mask structure.

2. The projection exposure system according to claim 1, wherein the evaluation unit is configured to determine the lateral imaging stability of the projection optics from the time resolved radiation intensity recorded at a temporal resolution of at least 10 Hz.

3. The projection exposure system according to claim 2, wherein the at least two test waves are spatially separate from each other in at least one plane of the projection optics.

4. The projection exposure system according to claim 1, wherein the input diffraction element is disposed on a mask side of the projection optics and the detection diffraction element is disposed on a substrate side of the projection optics.

5. The projection exposure system according to claim 1, further comprising an illumination diffraction element disposed in the optical path of the measurement radiation upstream of the input diffraction element and is configured to convert the measurement radiation into at least two measurement radiation partial beams with differing propagation directions.

6. The projection exposure system according to claim 5, further comprising an imaging optical element disposed between the illumination diffraction element and the input diffraction element and configured to direct the measurement radiation partial beams onto the input diffraction element.

7. The projection exposure system according to claim 5, wherein the illumination diffraction element and the input diffraction element are configured to convert each of the at least two measurement radiation partial beams from the illumination diffraction element into at least two diffraction individual beams by diffraction on the input diffraction element, and wherein at least one of the diffraction individual beams is produced by diffracting a first of the measurement radiation partial beams overlaid by one of the diffraction individual beams produced by diffracting a second of the measurement radiation partial beams such that the overlaid diffraction individual beams together form one of the test waves.

8. The projection exposure system according to claim 1, wherein the detection diffraction element is configured to produce, in addition to the first detection beam, at least a second detection beam and a third detection beam from the test waves, and wherein the second detection beam has at least a radiation portion of a first of the two test waves and the third detection beam has at least one radiation portion of the second of the two test waves, and the projection exposure system further comprises at least two further photo detectors arranged to record respective radiation intensities of the second detection beam and of the third detection beam.

9. The projection exposure system according to claim 1, further comprising an exposure radiation source configured to produce radiation for imaging the mask structures into the substrate plane, and a measurement radiation source independent of the exposure radiation source configured to produce the measurement radiation.

10. The projection exposure system according to any of claim 1, further comprising: an exposure optical path arranged to image the mask structures into the substrate plane, and a coupling mirror arranged to couple, on the mask side, the measurement radiation into the exposure optical path.

11. The projection exposure system according to claim 1, further comprising: an exposure optical path arranged to image the mask structures into the substrate plane, and an uncoupling mirror arranged to uncouple the test waves from the exposure optical path.

12. The projection exposure system according to claim 1, wherein the input diffraction element and the detection diffraction element are formed by a single diffraction element, and the projection exposure system further comprises a retroreflector configured to reflect the test waves back on themselves after the test waves pass through the projection optics, such that the test waves take a second pass through the projection optics and thereafter strike the detection diffraction element.

13. The projection exposure system according to claim 1, wherein the projection optics consists essentially of mirrors, and wherein individual regions of the surfaces of the mirrors are provided with respective reflective coatings selected in accordance with a wavelength of the measurement radiation.

14. The projection exposure system according to claim 1, wherein the projection optics are configured to image the mask structures with light in at least the extreme-ultraviolet frequency wavelength range into the substrate plane.

15. A method for monitoring a lateral imaging stability of projection optics arranged to image mask structures into a substrate plane of a projection exposure system for microlithography, comprising:
    irradiating measurement radiation onto an input diffraction element such that the measurement radiation is converted into at least two test waves with differing propagation directions, and then passing the test waves through the projection optics, such that a system pupil of the projection optics is illuminated by the at least two waves in areas which are separated locally from each other,
    causing the test waves, after passing through the projection optics, to strike a detection diffraction element, and producing, by diffraction, a detection beam which has a mixture of radiation portions of the at least two test waves, and
    recording the radiation intensity of the detection beam with a photo detector, time resolved, and from said recording, establishing the lateral imaging stability of the projection optics, wherein the lateral imaging stability comprises an ability of the projection optics to image mask structures stably into the substrate plane with regard to a lateral shift of the image of the mask structure.

16. The method of claim 15, wherein establishing the lateral imaging stability of the projection optics comprises determining the lateral imaging stability of the projection optics from the time resolved radiation intensity recorded at a temporal resolution of at least 10 Hz.

17. The method of claim 16, wherein the at least two test waves are spatially separate from each other in at least one plane of the projection optics.

18. The method of claim 15, wherein the input diffraction element is disposed on a mask side of the projection optics and the detection diffraction element is disposed on a substrate side of the projection optics.

19. The method of claim 15, further comprising converting the measurement radiation into at least two measurement radiation partial beams with differing propagation directions with an illumination diffraction element disposed in the optical path of the measurement radiation upstream of the input diffraction element.

20. The method of claim 19, further comprising directing the measurement radiation partial beams onto the input diffraction element with an imaging optical element disposed between the illumination diffraction element and the input diffraction element.

21. The method of claim 19, wherein the illumination diffraction element and the input diffraction element are configured to convert each of the at least two measurement radiation partial beams from the illumination diffraction element into at least two diffraction individual beams by diffraction on the input diffraction element, and wherein at least one of the diffraction individual beams is produced by diffracting a first of the measurement radiation partial beams overlaid by one of the diffraction individual beams produced by diffracting a second of the measurement radiation partial beams such that the overlaid diffraction individual beams together form one of the test waves.

22. The method of claim 15, wherein the detection diffraction element is configured to produce, in addition to the first detection beam, at least a second detection beam and a third detection beam from the test waves, and wherein the second detection beam has at least a radiation portion of a first of the two test waves and the third detection beam has at least one radiation portion of the second of the two test waves, and the projection exposure system further comprises at least two further photo detectors arranged to record respective radiation intensities of the second detection beam and of the third detection beam.

* * * * *